United States Patent
Masui et al.

(10) Patent No.: US 8,044,417 B2
(45) Date of Patent: Oct. 25, 2011

(54) ENHANCEMENT OF OPTICAL POLARIZATION OF NITRIDE LIGHT-EMITTING DIODES BY INCREASED INDIUM INCORPORATION

(75) Inventors: Hisashi Masui, Santa Barbara, CA (US); Hisashi Yamada, Ibaraki (JP); Kenji Iso, Fujisawa (JP); James S. Speck, Goleta, CA (US); Shuji Nakamura, Santa Barbara, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 327 days.

(21) Appl. No.: 12/364,258

(22) Filed: Feb. 2, 2009

(65) Prior Publication Data
US 2009/0194761 A1    Aug. 6, 2009

Related U.S. Application Data

(60) Provisional application No. 61/025,592, filed on Feb. 1, 2008.

(51) Int. Cl.
  *H01L 33/00*    (2010.01)
(52) U.S. Cl. ..... 257/96; 257/97; 257/103; 257/E33.023; 257/E33.025; 257/E33.028; 438/47
(58) Field of Classification Search ............ 257/96, 257/97, 103, E33.023, E33.025, E33.028
See application file for complete search history.

(56) References Cited

U.S. PATENT DOCUMENTS

| | | | |
|---|---|---|---|
| 5,473,173 A | 12/1995 | Takiguchi et al. | |
| 6,515,313 B1 | 2/2003 | Ibbetson et al. | |
| 6,580,099 B2 | 6/2003 | Nakamura et al. | |
| 6,833,564 B2 | 12/2004 | Shen et al. | |
| 7,115,908 B2* | 10/2006 | Watanabe et al. | 257/79 |
| 7,186,302 B2 | 3/2007 | Chakraborty et al. | |
| 7,221,000 B2* | 5/2007 | Shen et al. | 257/94 |
| 7,285,799 B2* | 10/2007 | Kim et al. | 257/79 |
| 7,518,159 B2* | 4/2009 | Masui et al. | 257/98 |
| 7,531,465 B2* | 5/2009 | Cho et al. | 438/781 |
| 7,723,746 B2* | 5/2010 | Masui et al. | 257/98 |
| 7,808,011 B2* | 10/2010 | Kim et al. | 257/98 |
| 7,816,699 B2* | 10/2010 | Park et al. | 257/98 |
| 2003/0168653 A1* | 9/2003 | Tsujimura et al. | 257/14 |
| 2005/0205884 A1* | 9/2005 | Kim et al. | 257/98 |
| 2005/0224826 A1 | 10/2005 | Keuper et al. | |
| 2005/0236627 A1* | 10/2005 | Kim et al. | 257/79 |
| 2006/0038191 A1* | 2/2006 | Onishi et al. | 257/96 |
| 2006/0043400 A1* | 3/2006 | Erchak et al. | 257/98 |
| 2007/0029541 A1* | 2/2007 | Xin et al. | 257/14 |
| 2007/0187700 A1* | 8/2007 | Kitaoka et al. | 257/79 |
| 2007/0284567 A1* | 12/2007 | Pokrovskiy et al. | 257/13 |

(Continued)

OTHER PUBLICATIONS

International Search Report mailing date Mar 13, 2009, International application No. PCT/US2009/032892, International filing date Feb. 2, 2009.

(Continued)

*Primary Examiner* — Ngan Ngo
(74) *Attorney, Agent, or Firm* — Gates & Cooper LLP (57) ABSTRACT

An increase in the Indium (In) content in light-emitting layers of light-emitting diode (LED) structures prepared on nonpolar III-nitride substrates result in higher polarization ratios for light emission than LED structures containing lesser In content. Polarization ratios should be higher than 0.7 at wavelengths longer than 470 nm.

20 Claims, 6 Drawing Sheets

U.S. PATENT DOCUMENTS

| | | | |
|---|---|---|---|
| 2007/0285000 A1* | 12/2007 | Lim et al. | 313/501 |
| 2008/0128727 A1* | 6/2008 | Erchak et al. | 257/98 |
| 2008/0128728 A1* | 6/2008 | Nemchuk et al. | 257/98 |
| 2008/0303039 A1* | 12/2008 | Craford et al. | 257/89 |
| 2010/0090242 A1* | 4/2010 | Cho et al. | 257/98 |
| 2010/0093123 A1* | 4/2010 | Cho et al. | 438/42 |
| 2010/0226404 A1* | 9/2010 | Kim et al. | 372/50.11 |
| 2010/0295090 A1* | 11/2010 | Craford et al. | 257/99 |
| 2011/0027920 A1* | 2/2011 | Yamazaki et al. | 438/23 |
| 2011/0037052 A1* | 2/2011 | Schmidt et al. | 257/13 |

OTHER PUBLICATIONS

Masui et al., "Optical polarization characteristics of m-oriented InGaN/GaN light-emitting diodes with various indium compositions in single-quantum-well structure," J. Phys. D: Appl. Phys. 41 (2008) 225104 (7pp).

Okamoto et al., "Dislocation-free m-plane InGaN/GaN light-emitting diodes on m-plane GaN single crystals", Jpn. J. Appl. Phys. 45, L1197 (2006).

Tsujimura et al., "Characteristics of polarized electroluminescence from m-plane InGaN-based light emitting diodes", Jpn. J. Appl. Phys. 46, L1010 (2007).

Nakagawa et al., "Temperature dependence of polarized electroluminescence from nonpolar m-plane InGaN-based light emitting diodes", Appl. Phys. Lett. 91, 171110 (2007).

Yamaguchi, "Anisotropic optical matrix elements in strained GaN quantum wells", Jpn. J. Appl. Phys. 46, L789 (2007).

* cited by examiner

ENHANCEMENT OF OPTICAL POLARIZATION OF NITRIDE LIGHT-EMITTING DIODES BY INCREASED INDIUM INCORPORATION

CROSS REFERENCE TO RELATED APPLICATIONS

This application claims the benefit under 35 U.S.C. Section 119(e) of co-pending and commonly-assigned U.S. Provisional Patent Application Ser. No. 61/025,592, filed on Feb. 1, 2008, by Hisashi Masui, Hisashi Yamada, Kenji Iso, James S. Speck, Shuji Nakamura and Steven P. DenBaars, entitled "ENHANCEMENT OF OPTICAL POLARIZATION OF NITRIDE LIGHT-EMITTING DIODES BY INCREASED INDIUM INCORPORATION," which application is incorporated by reference herein.

This application is related to the following co-pending and commonly-assigned U.S. patent applications:

U.S. Utility application Ser. No. 12/364,272, filed on Feb. 2, 2009, by Hisashi Masui, Hisashi Yamada, Kenji Iso, Asako Hirai, Makoto Saito, James S. Speck, Shuji Nakamura and Steven P. DenBaars, entitled "ENHANCEMENT OF OPTICAL POLARIZATION OF NITRIDE LIGHT-EMITTING DIODES BY WAFER OFF-AXIS CUT," which application claims the benefit under 35 U.S.C. Section 119(e) of co-pending and commonly-assigned U.S. Provisional Application Ser. No. 61/025,600, filed on Feb. 1, 2008, by Hisashi Masui, Hisashi Yamada, Kenji Iso, Asako Hirai, Makoto Saito, James S. Speck, Shuji Nakamura and Steven P. DenBaars, entitled "ENHANCEMENT OF OPTICAL POLARIZATION OF NITRIDE LIGHT-EMITTING DIODES BY WAFER OFF-AXIS CUT,"

which applications are incorporated by reference herein.

BACKGROUND OF THE INVENTION

1. Field of the Invention

This invention relates to light-emitting diodes and more particularly to the enhancement of optical polarization of nitride light-emitting diodes by increased Indium (In) incorporation.

2. Description of the Related Art

Light-emitting diodes (LEDs) have been used in the last thirty years as indicator lamps, local illuminators, and optical transmitters, among their many applications. In the last ten years, high-brightness aluminum-indium-gallium nitride [(Al, In, Ga)N] based blue and green LEDs have been developed and have started to emerge in general lighting and full-color display applications.

In terms of LED fabrication, because of the incoherent and un-polarized light emission from conventional LEDs, it is not essential to define a particular die orientation of an LED package when the die is attached to the package. In common LED fabrication, die orientation is only significant when an LED wafer is diced, which is why LED photolithographic patterning onto a wafer is carried out by aligning the patterns along crystallographic directions. This alignment process makes die separation reliable and results in higher production yield.

In the case of AlInGaN LEDs prepared on an insulating substrate (for example, sapphire), where two electrical contacts are made on one side of an LED die, die orientation in relation to the package is significant in terms of position of the positive and negative metal contacts. These alignments for reliable die separation and electrical contacts are common practice for any semiconductor devices, not necessarily only in LED fabrication. However, LED die alignment has never been considered in fabrication in terms of emitted light properties.

Figure 1:
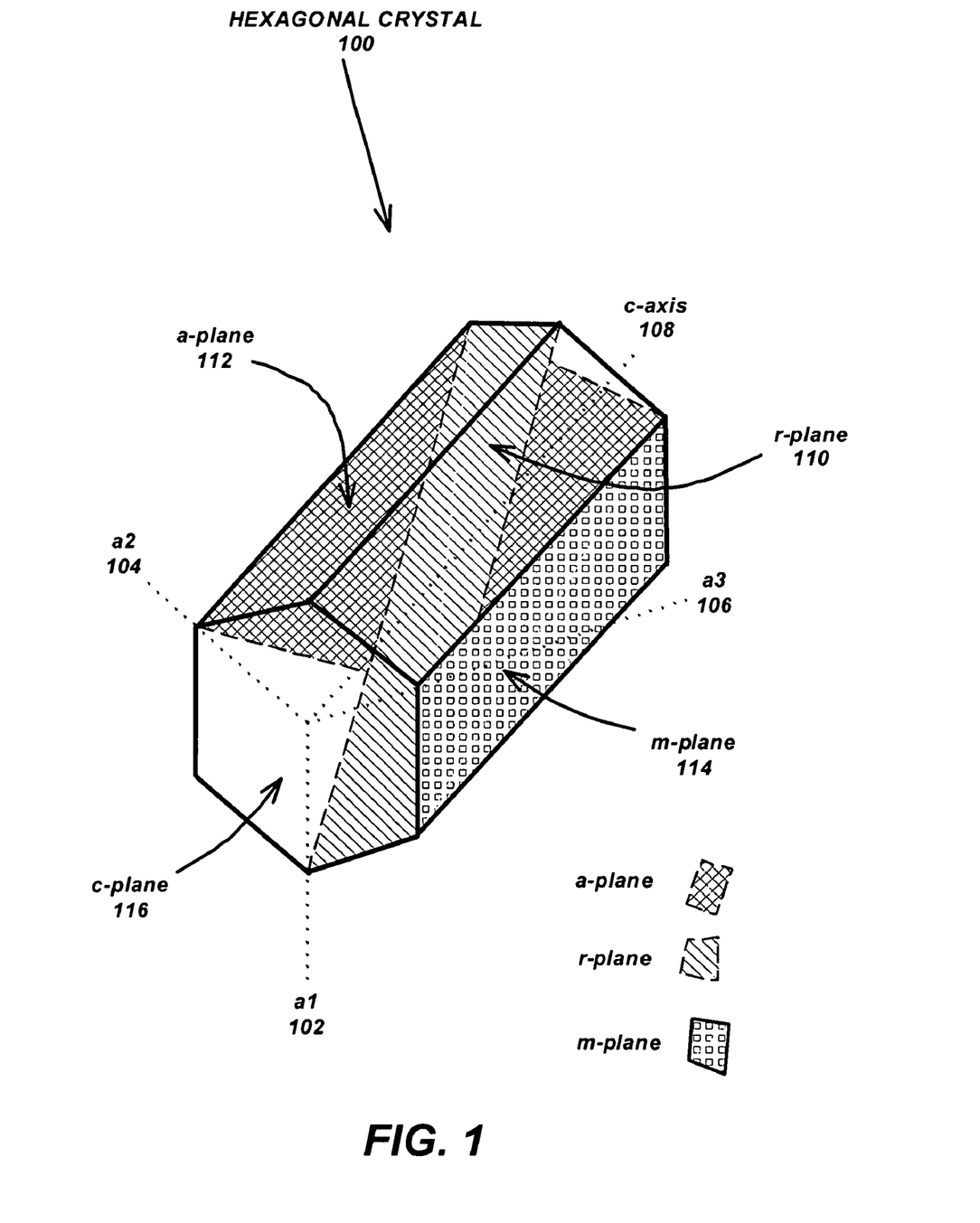
FIG. 1 is a schematic of a generic hexagonal crystal structure and crystal planes of interest.

Internal electrical polarization is a unique property of the AlInGaN system among the semiconductors used in optoelectronics, and this property originates in the hexagonal crystallographic structure of that material system. FIG. 1 schematically shows a generic hexagonal crystal structure 100 with principal crystallographic axes a1 102, a2 104, a3 106, c-axis 108 and typical crystallographic planes of interest (r-plane 110, a-plane 112, m-plane 114, and c-plane 116), with their labeling conventions.

Figure 2:
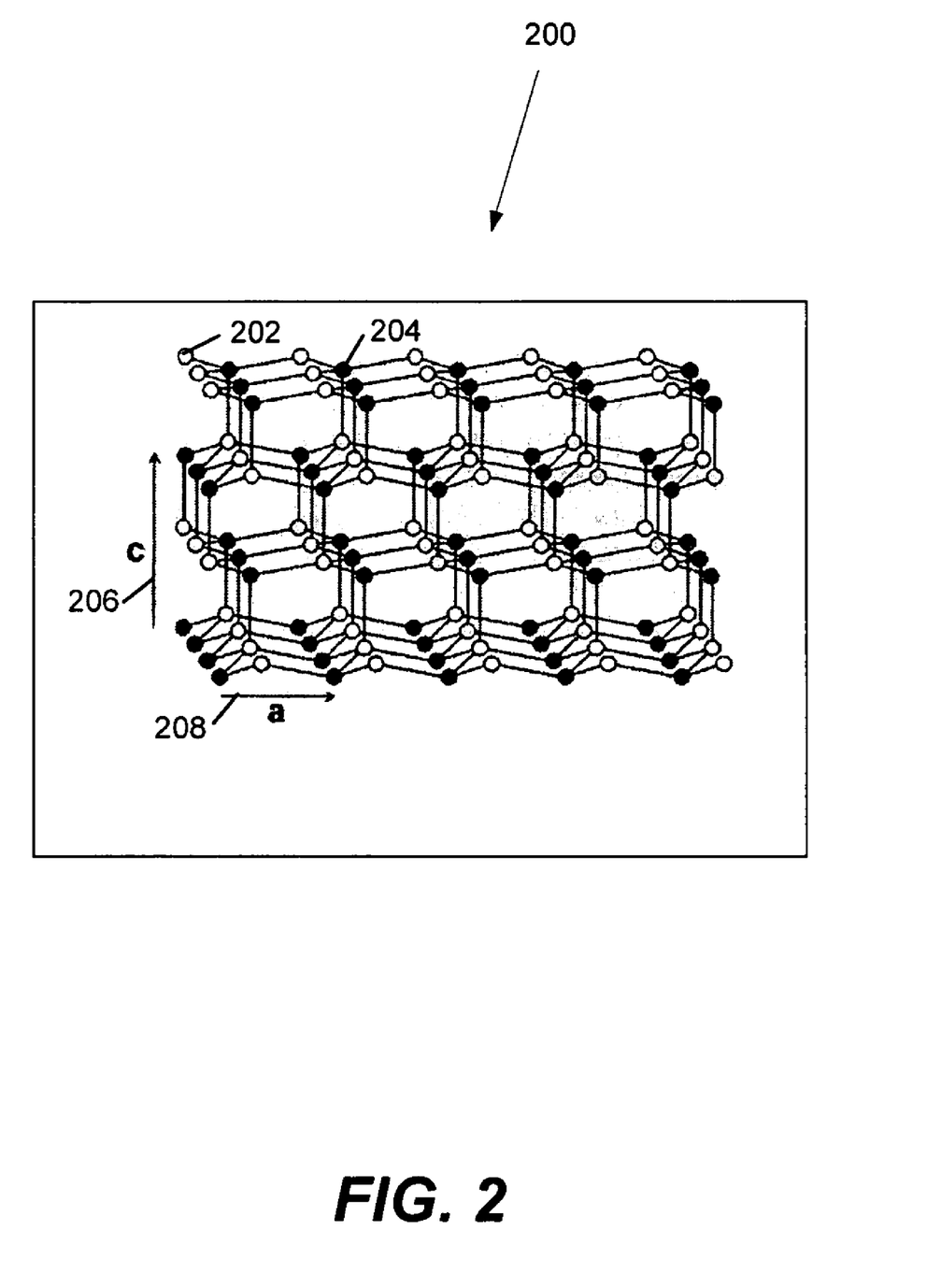
FIG. 2 illustrates the arrangement of atoms in a GaN crystal, wherein open circles represent Ga and solid circles represent N.

Electrical polarization is created in the hexagonal structure due to its lack of inversion symmetry along the c-axis. For example, in the case of GaN, FIG. 2 illustrates the arrangement of atoms in a GaN crystal 200, wherein open circles 202 represent gallium (Ga) atoms and solid circles 204 represent nitrogen (N) atoms. Along the c-axis 206 of the GaN 200 shown in FIG. 2, Ga atoms 202 (cation, positively charged) and N atoms 204 (anion, negatively charged) are positioned alternately and, as a whole, electric neutrality is maintained. Also shown in FIG. 2 is the a-axis 208.

However, because of the lack of inversion symmetry, there exists an internal electric field along the c-axis when the atoms are displaced from their ideal positions relative to each other along this c-axis. Since atoms in the AlInGaN system usually do not maintain their ideal positions, this polarization field almost always exists along the c-axis. For this reason, the c-plane is called a polar plane. Polarization fields do not exist along any of the a-axes or m-axes, due to the inversion symmetry along these particular axes. For this reason, a-planes and m-planes are called nonpolar planes. For these nonpolar planes, the polarization vector (which expresses direction and strength of the polarization field) is parallel to the planes, since the net polarization vector is parallel to the c-axis.

AlInGaN materials are conventionally grown in the c-direction (i.e., the direction along the c-axis), therefore on the c-plane. LEDs grown on the c-plane show negligible light polarization. On this c-plane, the polarization field has no in-plane component, and the isotropic mechanical stress within the c-plane in a quantum well (QW) structure of an LED does not change the nature of carrier recombination in the QW.

It has recently become possible to prepare AlInGaN LEDs on a- and m-planes. These LEDs exhibit linearly polarized light emission. The polarization field is in a particular direction (c-direction) in the plane, and the stress in the QW is anisotropic due to different degrees of lattice mismatch between the substrate and QW in the two perpendicular directions in the a- or m-plane. The inventors have confirmed that the emitted light from these nonpolar LEDs is linearly polarized in a direction perpendicular to the c-axis. Linearly polarized light is an electromagnetic wave that has its electric field only in one plane perpendicular to the wave's propagation. Non-polarized light has its electric field evenly distributed in directions in planes perpendicular to the wave's propagation. A principal application for polarized light is backlighting for liquid crystal displays (LCDs), for which LEDs are beneficial due to their compactness and energy efficiency as compared to conventional cold cathode fluorescent tubes.

AlInGaN LEDs prepared on a semi-polar plane have also been confirmed to emit polarized light. The projection of the polarization vector, which is parallel to the c-axis, lies in the semi-polar plane, similar to the nonpolar plane case.

Polarized light emission has been experimentally confirmed from LEDs prepared in nonpolar and semipolar orientations of (Al, In, Ga)N. While all conventional LEDs emit un-polarized light, polarized light emission is believed to be useful in certain applications such as backlighting for LCDs.

To take the advantage of polarized light emission, high polarization ratios are favorable. Thus, there is a need in the art for improved techniques for obtaining high polarization ratios in LEDs.

SUMMARY OF THE INVENTION

The present invention provides a technique to obtain high polarization ratios from nonpolar LEDs. Nonpolar LEDs that have a high In content in their light-emitting layers tend to possess light-emitting characteristics with high polarization ratios. LEDs emitting at a wavelength of 477 nm (corresponding to an In content or composition of approximately 28%) have been confirmed to provide the highest polarization ratio (0.87) as compared to any other examined LEDs emitting at wavelengths shorter than 477 nm.

To overcome the limitations in the prior art described above, and to overcome other limitations that will become apparent upon reading and understanding the present specification, the present invention discloses an LED that emits polarized light.

The LED may comprise one or more light-emitting layers, wherein an In content of the light-emitting layers is such that a polarization ratio of the polarized light emitted by the light-emitting layers is greater than 0.8. The light-emitting layers with the In content may be formed on a III-nitride layer, wherein the In content increases a strain in the light-emitting layers due to an increased lattice mismatch with the III-nitride layer, in order to increase the polarization ratio above 0.8.

The LED may comprise one or more $(Al_zIn_yGa_x)N$ (where $0 \leq x \leq 1$, $0 \leq y \leq 1$, $0 \leq z \leq 1$, and $x+y+z=1$) semiconductors, wherein the $(Al_zIn_yGa_x)N$ semiconductors may be prepared epitaxially on a nonpolar orientation of a wurtzite crystal or epitaxially on a GaN substrate or GaN template (wherein the GaN template is a GaN layer prepared on a foreign substrate, for example). Furthermore, the $(Al_zIn_yGa_x)N$ semiconductors may be prepared epitaxially on an $(Al_zIn_yGa_x)N$ substrate or template which is not GaN, with $0 \leq x < 1$, $0 \leq y \leq 1$, $0 \leq z \leq 1$, and $x+y+z=1$, to set a platform for strain management different from that of GaN.

The LED may comprise a quantum-well (QW) structure or double-hetero (DH) structure, wherein the QW (a single QW structure or a multiple QW structure, for example) or DH structure includes a light-emitting active layer embedded between one or more barrier layers or cladding layers that have a larger band gap than a band gap of the active layer.

The active layer may comprise $In_yGaN$ with an In content (y) in a range $0<y \leq 1$, wherein the In content controls induced strain in the active layer, and the induced strain controls a degree of polarization of the polarized light. For example, the active layer may comprise $(In_yGa_x)N$ (where $0 \leq x \leq 1$, $0<y \leq 1$, and $x+y=1$) embedded between one or more $In_yGaN$ or GaN layers that have smaller In content (y) value than a y value the active layer. In another example, the active layer is AlInGaN to adjust strain in the active layer to control a degree of polarization of the polarized light. The active layer may be thinner than a critical thickness to avoid generation of misfit dislocations that release the strain.

The present invention further discloses a method of fabricating an LED, comprising controlling a degree of polarization of light emitted from the LED. The controlling may be changing an In content in the active layer to control induced strain. For example, if the active layer comprises $(In_yGa_x)N$ (where $0 \leq x \leq 1$, $0<y \leq 1$, and $x+y=1$) embedded between one or more $In_yGaN$ or GaN barrier layers, the controlling may comprise changing the In content (y, $0<y \leq 1$) in the active layer to control the induced strain, while In content of the barrier layers is unchanged. In addition, the method may further comprise changing the Aluminum content of the active layer to AlInGaN to adjust strain while the Al content of the barrier layers is unchanged.

As a further example, the controlling may be increasing the degree of polarization by increasing the In content in one or more light-emitting layers of the LED. The light-emitting layers with the In content may be formed on a III-nitride layer, wherein the increasing of the In content increases a strain in the light-emitting layer due to an increased lattice mismatch with the III-nitride layer, in order to increase the polarization ratio.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Terminology

It is worthwhile here to clarify the terminology used in this disclosure, which is based on the convention of this particular research field of gallium nitride (GaN) related materials.

Electrical polarization and light polarization are both important concepts in this invention, but are different physical phenomena, although they both have been referred to as "polarization".

Electrical polarization relates to polarization vectors and internal polarization electric fields, and is based on the crystallographic structure of a particular material system. In this case, the material is referred to as a "polar" material. If a material does not have internal electrical polarization, it is referred as a "nonpolar" material.

Light polarization relates to electromagnetic wave emission and the light is often referred to as "polarized" light. The concept of light polarization is based on how electromagnetic waves propagate in space.

Crystallographic planes of polar materials that have a polarization vector normal to the plane are referred to as "polar" planes. Those planes that have a polarization vector parallel to the plane are referred as "nonpolar" planes. Those planes that have a polarization vector at any other angle relative to the plane are referred as "semipolar" planes. When this convention (polar, nonpolar, or semipolar) is applied to a device (for example, LEDs), it means the device is prepared on that (polar, nonpolar, or semipolar) crystal plane.

Overview

Nonpolar and semipolar AlInGaN-based LEDs have been shown to emit polarized light, while conventional LEDs only emit un-polarized light. The highest reported value of polarization ratio for nonpolar LEDs is 0.8 (room temperature measurement). For practical applications, still higher polarization ratios are required. The present invention accomplishes higher polarization ratios in electroluminescence from nonpolar LEDs by increasing the In content in light-emitting layers.

For example, the present invention may use InGaN for one or more light emitting layers, wherein the InGaN was grown on GaN so that different degrees or amounts of strain were introduced in the InGaN layers with different In composition. The In composition and different amounts of strain were confirmed by emission wavelength difference.

Strain in GaN layers may be changed by, for example, using AlGaN substrates and growing GaN layers on top of the AlGaN substrate. Specifically, the present invention describes growing InGaN with different In compositions on GaN substrates to introduce different degrees of strain. For example, too large misfits (caused by too large differences in lattice constants) between the InGaN layer and the GaN substrate may introduce misfit dislocations that relax strain, thereby resulting in unstrained InGaN layers even with high In compositions.

Technical Description

Polarized light emission from nonpolar and semipolar LEDs have been reported. The polarization ratio is a number to indicate degrees of polarization of light, 0 being no polarization for the light and 1 being fully polarized light. A typical value for a polarization ratio for these nonpolar and semipolar LEDs is 0.8. For practical applications using these polarized light sources, high polarization ratios are required.

There are several ways to increase polarization ratios of nonpolar LEDs. Induced strains by changing the LED structure and/or the substrate used will affect polarization ratios. Techniques may include the introduction of strain-controlling layers in the LED structure, or the use of foreign substrates. Carefully prepared LED chips can reduce stray light and increase polarization ratios. Operating LEDs at low temperature (~100 K) is another way to increase polarization ratio; however, this is not practical for light source applications. External techniques, for example, the use of a polarizer, are known, but not preferred in terms of energy efficiency.

The technique described in the present invention is one way to improve polarization ratios. The inventors have experimentally confirmed that polarization ratios are improved by increasing the In content in the light-emitting layers.

Figure 3:
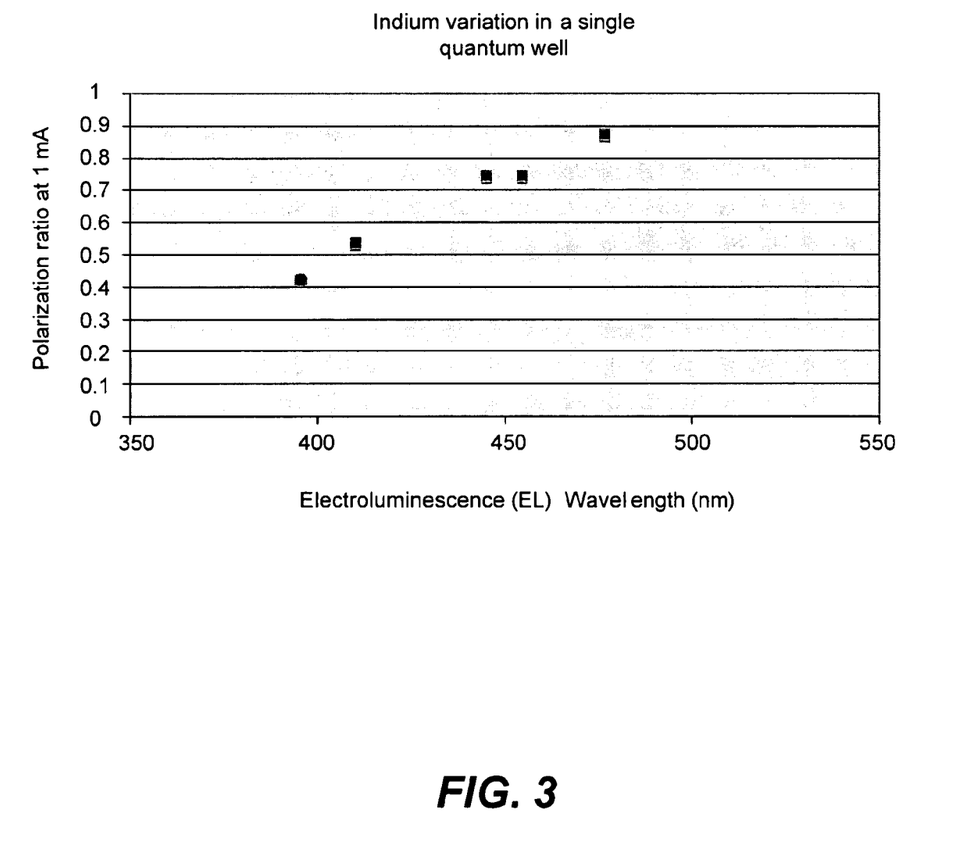
FIG. 3 is a graph that illustrates the polarization ratio, at 1 mA drive current, as a function of electroluminescence (EL) emission wavelength (nanometers, nm), wherein the EL is emitted by a light-emitting layer comprising a single quantum well (SQW) in response to the 1 mA drive current, the emission wavelength is varied by varying the In composition in the SQW, an emission wavelength of 477 nm corresponds to an In composition of 28%, emission wavelength and In composition have a linear relationship, and an emission wavelength of 365 nm corresponds to an In composition of 0% (note that a polarization ratio of 0.00 can be achieved using c-plane LEDs).

FIG. 3 is a graph that illustrates how the polarization ratios of light emissions from an LED are increased by increasing the In content in light-emitting layers of a nonpolar LED, wherein the light-emitting layers are comprised of a III-nitride material. As shown in FIG. 3, emission wavelength and In content have an approximately linear relationship, for example, an emission wavelength of 477 nm corresponds to an In composition of 28%, and an emission wavelength of 365 nm corresponds to an In composition of 0%. Moreover, the polarization ratio tended to increase as emission wavelength increased, directly corresponding to an increase in the In content in the light-emitting layer. Specifically, the polarization ratio increases as the emission wavelength and In composition increases.

These effects have been studied theoretically but have not been demonstrated experimentally. The inventors attribute these phenomena to the strain state of light-emitting layers in accordance with theoretical studies.

Nonetheless, LEDs emitting at a wavelength of 477 nm (corresponding to an In content of approximately 28%) have been confirmed to provide the highest polarization ratio (0.87) as compared to any other examined LEDs emitting at wavelengths shorter than 477 nm. Thus, nonpolar LEDs that have a high In content in their light-emitting layers tend to possess light-emitting characteristics with high polarization ratios.

Possible Modifications and Variations

A possible modification of this invention is to introduce strain-controlling layers in the LED structure. As high polarization ratios are caused by high strain in the light-emitting layers according to theory and experiments, the introduction of strain-controlling layers will change polarization ratios. For instance, inserting AlGaN layers on either or both sides of a light-emitting InGaN layer will increase strain in the InGaN layer. This is because AlGaN has a smaller lattice constant than GaN, and an InGaN layer experiences a larger lattice mismatch. These strain-controlling layers do not have to be inserted in the vicinity of InGaN light-emitting layers, but anywhere in the LED structure in such a way that strain in InGaN layers is enhanced.

The present invention may be applied to other devices, such as lasers.

Process Steps

Figure 4:
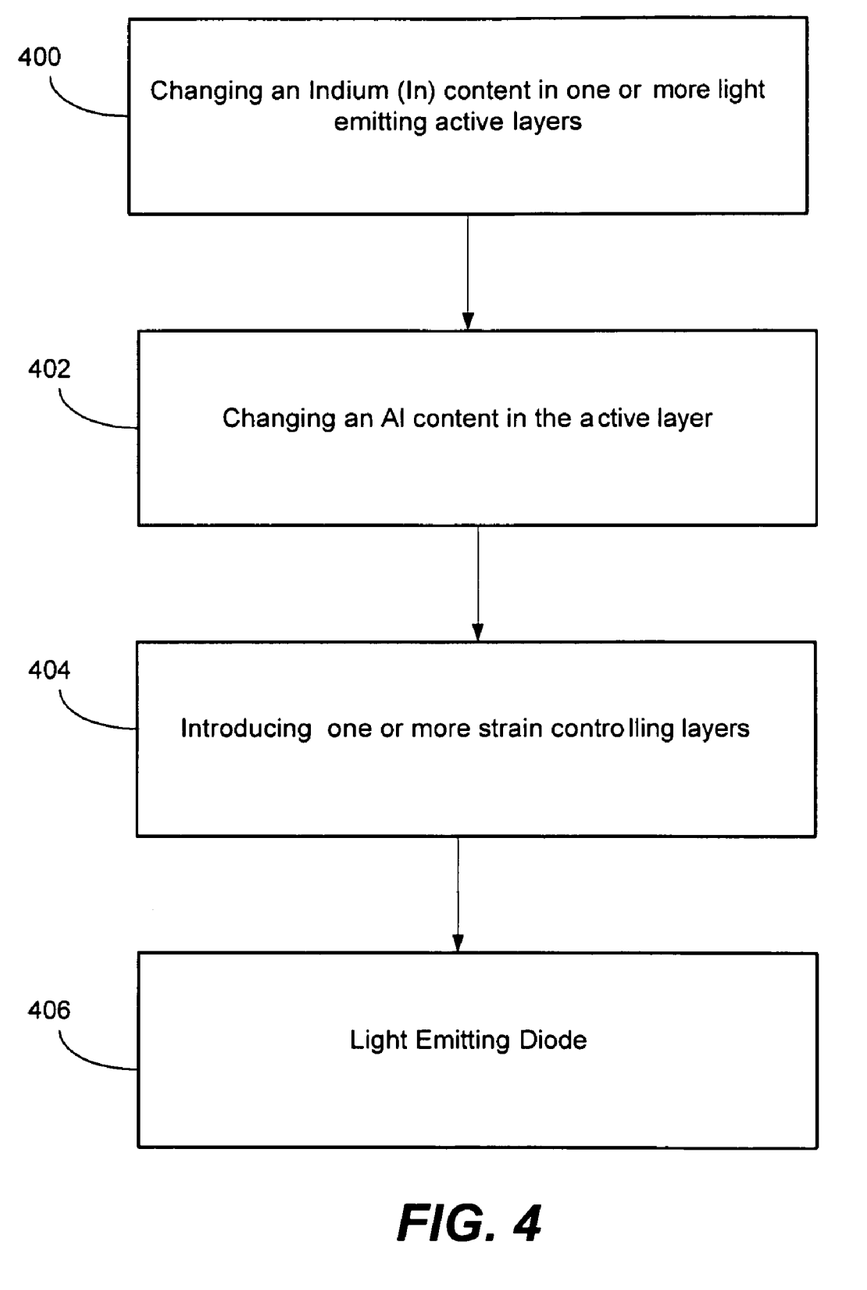
FIG. 4 is a flowchart illustrating a method of fabricating an LED and controlling a degree of light polarization emitted from the LED.

FIG. 4 is a flowchart illustrating controlling a degree of polarization (e.g. polarization ratio) of light emitted from an LED. The method comprises the following steps.

Block 400 represents changing or controlling In content in an active layer (e.g. one or more light-emitting layers) to control the degree of polarization or polarization ratio of the light emitted from the active layer of the LED. The controlling may be changing an In content in the active layer to control induced strain. For example, the controlling may be increasing the degree of polarization (or polarization ratio) by increasing the In content in the light-emitting active layers of the LED. Typically the active layer comprises $(In_yGa_x)N$ (where $0 \leq x \leq 1$, $0 < y \leq 1$, and $x+y=1$) embedded between one or more $In_yGaN$ or GaN barrier layers. In this case, the step may comprise changing an In content in the active layer of the LED to control induced strain, while the In content of the barrier layers is unchanged. Typically, the light-emitting layers with the In content are formed (e.g. grown) on a III-nitride layer, wherein the increasing of the In content increases a strain in the light-emitting layers due to an increased lattice mismatch with the III-nitride layer, in order to increase the polarization ratio.

Block 402 represents changing an Aluminum (Al) content of the active layer, such that the active layer contains AlInGaN, to adjust strain, while the Al content of the barrier layers is unchanged (optional step).

Block 404 represents introducing one or more strain-controlling layers in the LED, on either or both sides of the light-emitting layers, to change the polarization ratios or degree of light polarization (optional step).

Block 406 represents the end result of the method, an LED. The LED may be a nonpolar (or semipolar) LED, for example.

Figure 5A:
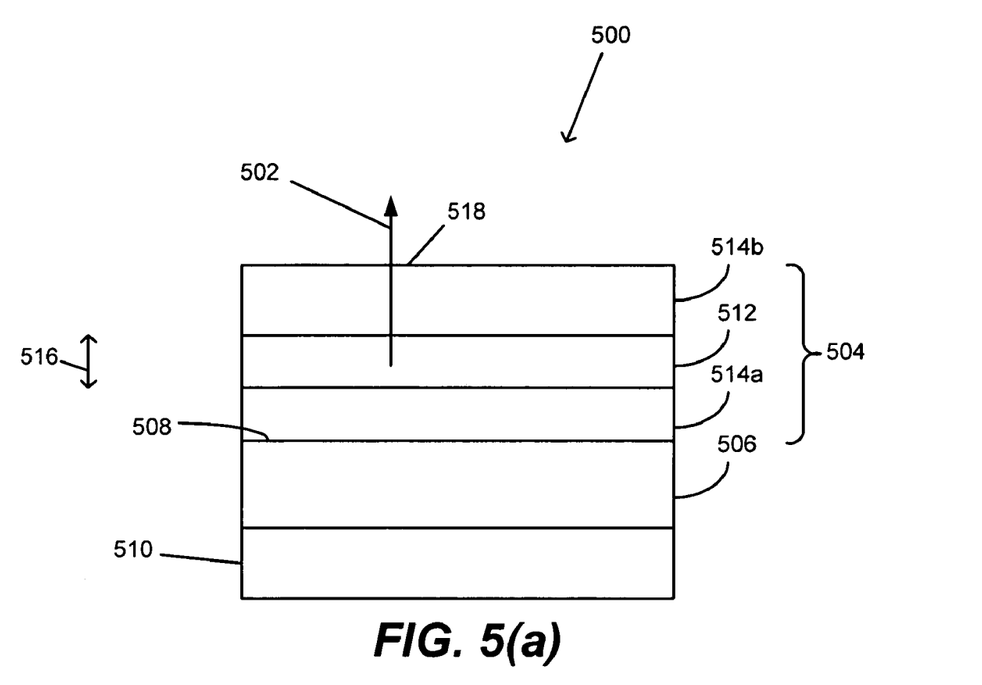
FIG. 5(a) is a cross-sectional schematic of an LED structure.

FIG. 5(a) is a cross-sectional schematic of an LED 500 that emits polarized light 502. The LED 500 may be based on, or comprise, one or more $(Al_zIn_yGa_x)N$ (where $0 \leq x \leq 1$, $0 \leq y \leq 1$, $0 \leq z \leq 1$, and $x+y+z=1$) semiconductor layers 504. The $(Al_zIn_yGa_x)N$ semiconductors 504 may be prepared (e.g. grown) epitaxially on a substrate or template 506, such as a wurtzite crystal. For example, the substrate or template 506 may comprise a Group III-nitride such as GaN or $(Al_zIn_yGa_x)N$ with $0 \leq x < 1$, $0 \leq y \leq 1$, $0 \leq z \leq 1$, and $x+y+z=1$. The GaN template 506 may be a GaN layer prepared on a foreign substrate 510 such as sapphire, spinel, SiC, and Si. In addition, the $(Al_zIn_yGa_x)N$ semiconductors 504 may be prepared (e.g. grown) epitaxially on a nonpolar orientation (e.g. nonpolar plane 508 such as an a-plane or m-plane) of the wurtzite crystal.

If the substrate or template 506 is $(Al_zIn_yGa_x)N$ (but not GaN), the substrate or template 506 may set a strain in the $(Al_zIn_yGa_x)N$ semiconductors 504 that controls a degree of polarization of the polarized light 502. An $(Al_zIn_yGa_x)N$ substrate 506 or template (where $0 \leq x < 1$, $0 \leq y \leq 1$, $0 \leq z \leq 1$, and $x+y+z=1$), that is not GaN, can set another platform of strain management different from that of GaN.

The LED comprises an active layer 512 with an In content, wherein the In content controls (e.g. by changing In content) induced strain in the active layer 512, and the induced strain controls a degree of polarization of the polarized light 502 emitted by the active layer 512. For example, the In content of the active layer (e.g. light-emitting layers) 512 may be such that a polarization ratio of the polarized light 502 emitted by the light-emitting layers 512 is greater than 0.8. Typically, the light-emitting layers 512 with the In content are formed (e.g. grown) on a III-nitride layer 514a, 506, wherein the In content increases a strain in the light-emitting layers 512 due to an increased lattice mismatch with the III-nitride layer 514a, 506, in order to increase the polarization ratio above 0.8.

The LED 500 may comprise a QW structure or DH structure, wherein the QW or DH structure includes a thin light-emitting active layer 512 embedded between one or more barrier layers 514a, 514b or cladding layers that have a larger band gap than a band gap of the active layer 512. Thus, the active layer 512 may be a single QW structure or a multiple QW structure, for example.

The active layer 512 may comprise $In_yGaN$ with an In content y in a range $0 < y \leq 1$, wherein the In content controls induced strain in the active layer 512, and the induced strain controls a degree of polarization of the polarized light 502. For example, the active layer 512 may be $(In_yGa_x)N$ (where $0 \leq x \leq 1$, $0 < y \leq 1$, and $x+y=1$) embedded between one or more $In_yGaN$ or GaN layers 514a, 514b that have smaller y value than a y value of the active layer 512. In another example, the active layer 512 may further comprise Al, thus AlInGaN, to adjust strain, while the barrier layers 514a, 514b are unchanged. The Al content in the active layer 512 may adjust strain in the active layer 512 to control a degree of polarization of the polarized light 502 emitted by the active layer. The active layer 512 may be maintained sufficiently thin (thinner than a critical thickness 516) to avoid generation of misfit dislocations that may release strain (e.g. to avoid releasing the strain, typically in the active layer 512, that controls the degree of polarization).

Also shown is the top surface 518 of the device 500 which transmits light 502 emitted by the active region 512.

Figure 5B:
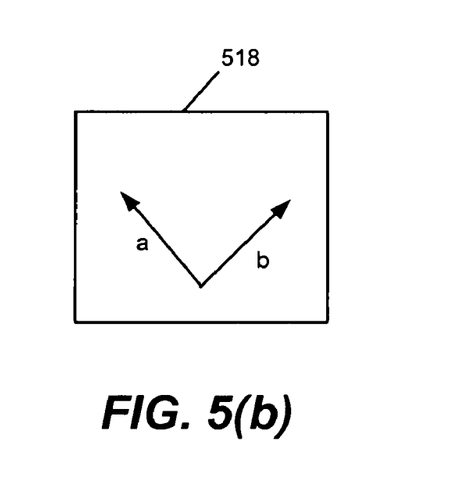
FIG. 5(b) is a schematic of a top view of the LED in FIG. 5(a) and illustrating polarization directions a and b, wherein a and b are orthogonal and in the plane of the device surface.

FIG. 5(b) is a schematic top view (along normal of surface 518) of FIG. 5(a), illustrating polarization ratio of light 502 emitted in a direction perpendicular to surface 518. The polarization ratio of light 502 ($\rho$) is commonly defined as $\rho = (I_a + I_b)/(I_a - I_b)$, where $I_a$ and $I_b$ are the intensities of the light 502 having polarization (electric fields) parallel to the in-plane directions (i.e., parallel to, or in the plane of, the device surface 518) a and b respectively, where the a and b directions are orthogonal to each other. In other words, $I_a$ is the intensity of the light 502 having polarization in the direction a, and $I_b$ is the intensity of the light 502 having polarization in the direction b. When $\rho$ is zero, that is $I_a = I_b$, light 502 is unpolarized. When $I_a$ is not equal to $I_b$, light 502 is (partially) linearly polarized. When $I_a$ or $I_b$ is zero (that is, $\rho$ is unity), light 502 is (perfectly) linearly polarized.

For ease of discussion (so that a and b are parallel to the surface 518), FIG. 5(a) only shows light 502 emerging perpendicular to surface 518; however light emerging at other angles and from other surfaces is possible. Thus, while the present invention's measurements of polarization ratio were performed by observing the light 502 emitted perpendicular to the surface 518, the polarizations a and b are typically determined with respect to the direction of observation (i.e., direction of light 502 propagation). Thus, a and b are not necessarily parallel to the surface 518 if light 502 does not propagate perpendicular to the surface 512. In reality, light 502 propagates at any direction from the surface 512, and the polarizations a and b are with respect to the direction of the observation (placement of the eye).

Advantages and Improvements

The present invention has demonstrated polarization enhancement of electroluminescence in LEDs by increasing In content. The present invention only depends on increased In content (unless strain-controlling layers are inserted) in light-emitting layers of devices. Hence, no extra processes in material growths, clean room processing, nor device packaging are required. Changes in In content have been commonly used for changing emission wavelengths, but not for the degree of light polarization.

One particular application of this invention is for the backlighting of LCDs. LCDs are a growing technology in flat panel displays. Because they are not self-emitting devices, LCDs require a light source in the display unit. The light source is now changing from cold cathode fluorescent tubes to LEDs, so it is expected that this segment of the LED market will increase.

Figure 6A:
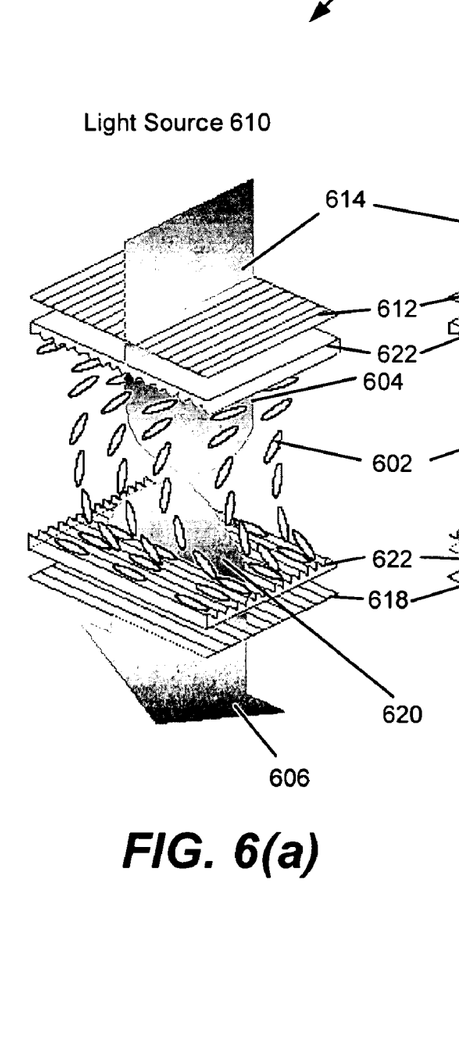
FIG. 6(a) and FIG. 6(b) illustrate the principle of LCD operation, wherein, in a conventional technique, polarized light is obtained after passing the first polarizer.
Figure 6B:
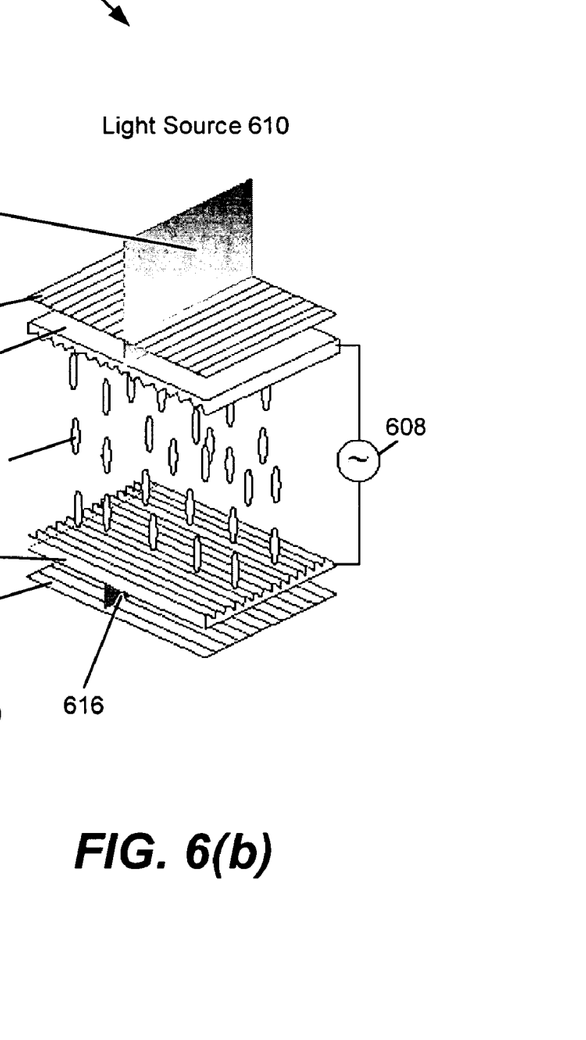

LCDs 600 are based on light polarization technology, as shown in FIG. 6(a) and FIG. 6(b). A thin layer of liquid crystal 602 works as an electrically controlled polarization rotator. When linearly polarized light 604 is incident on a liquid crystal layer 602, the light 604 can be passed though (light output 606, FIG. 6(a)) or blocked (no light output 606, FIG. 6(b)) by electrically operating 608 the liquid crystal 602. What an LCD unit 600 requires is a light source 610 combined with a linear polarizer 612 which is a plastic sheet to filter out unfavorably polarized components of the source light 614 emitted by the light source 610. For example, FIG. 6(b) shows then when an alternating current (AC) voltage 608 is applied to the liquid crystal 602, the liquid crystal 602 does not rotate the polarization of light 604 so that the light output 616 is blocked by polarizer 618. FIG. 6(a) shows that in the absence of an applied AC voltage 608, the liquid crystal 602 rotates the polarization of light 604 to form light 620 that has a polarization that passes through polarizer 618 to form light output 606. Also shown in FIG. 6(a) and FIG. 6(b) is an alignment film 622.

The polarizer 612 transmission is typically 80%, therefore 20% of the light 614 is lost due to the polarizer 612. If one or more polarized LEDs (as the light source 610) are applied to LCDs, the polarizer 612 is no longer required, and display brightness is greatly increased. In addition, the weight of the display unit 600 is decreased. To attain these advantages, high polarization ratios are required for the LED 610. The present invention is a simple technique to contribute towards this aim.

REFERENCES

The following references are incorporated by reference herein:

1. K. Okamoto, et al., "Dislocation-free m-plane InGaN/GaN light-emitting diodes on m-plane GaN single crystals," Jpn. J. Appl. Phys. 45, L1197 (2006). This paper reports a polarization ratio of 0.77 on nonpolar LEDs fabricated on a bulk-GaN substrate.
2. H. Tsujimura, et al., "Characteristics of polarized electroluminescence from m-plane InGaN-based light-emitting diodes," Jpn. J. Appl. Phys. 46, L1010 (2007). This paper reports polarization ratios 0.8 at maximum on nonpolar LEDs fabricated on a bulk-GaN substrate.
3. S. Nakagawa, "Temperature dependence of polarized electroluminescence from nonpolar m-plane InGaN-based light-emitting diodes," Appl. Phys. Lett. 91, 171110 (2007). This paper reports temperature effects on polarization ratios. The highest number reported is 0.98 that has been measured at 100 K. 0.85 is reported as a polarization ratio at room temperature.
4. A. A. Yamaguchi, "Anisotropic optical matrix elements in strained GaN quantum wells," Jpn. J. Appl. Phys. 46, L789 (2007). This paper presents theoretical calculations of polarization on nonpolar and other inclined planes.
5. Hisashi Masui, Hisashi Yamada, Kenji Iso, Shuji Nakamura, and Steven P. DenBaars, entitled "Optical polarization characteristics of m-oriented InGaN/GaN light-emitting diodes with various indium compositions in single-quantum-well structure," J. Phys. D: Appl. Phys. 41 (2008) 225104 (7 pp).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A light-emitting diode (LED) that emits polarized light comprising:
   one or more III-nitride light-emitting layers formed on a III-nitride layer, wherein the III-nitride light-emitting layers have an Indium (In) content that increases a polarization ratio of light emitted by the III-nitride light-emitting layers to greater than 0.8.
2. The LED of claim 1, wherein the In content increases a strain in the III-nitride light-emitting layers due to an increased lattice mismatch with the III-nitride layer, in order to increase the polarization ratio above 0.8.
3. The LED of claim 1, wherein the III-nitride light-emitting layers comprise one or more $(Al_zIn_yGa_x)N$ (where $0 \leq x \leq 1$, $0 \leq y \leq 1$, $0 \leq z \leq 1$, and $x+y+z=1$) semiconductors.
4. The LED of claim 3, wherein the $(Al_zIn_yGa_x)N$ semiconductors are prepared epitaxially on a nonpolar orientation of a wurtzite crystal.
5. The LED of claim 3, wherein the $(Al_zIn_yGa_x)N$ semiconductors are prepared epitaxially on a GaN substrate or GaN template.
6. The LED of claim 5, wherein the GaN template is a GaN layer prepared on a foreign substrate.
7. The LED of claim 3, wherein the $(Al_zIn_yGa_x)N$ semiconductors are prepared on an $(Al_zIn_yGa_x)N$ substrate or template which is not GaN, with $0 \leq x < 1$, $0 \leq y \leq 1$, $0 \leq z \leq 1$, and $x+y+z=1$, to set a platform for strain management different from that of GaN.
8. The LED of claim 1, wherein the III-nitride light-emitting layers comprise a quantum-well (QW) structure or double-hetero (DH) structure, and wherein the QW or DH structure includes a light-emitting active layer embedded between one or more barrier layers or cladding layers that have a larger band gap than a band gap of the active layer.
9. The LED of claim 8, wherein the active layer comprises $(In_yGa_x)N$ (where $0 \leq x \leq 1$, $0 < y \leq 1$, and $x+y=1$) embedded between one or more $In_yGaN$ or GaN layers that have smaller In content (y) value than a y value of the active layer.
10. The LED of claim 8, wherein the active layer is a single QW structure or a multiple QW structure.
11. The LED of claim 8, wherein the active layer comprises $In_yGaN$ with an Indium (In) content y in a range $0 < y \leq 1$, the In content controls induced strain in the active layer, and the induced strain controls a degree of polarization of the polarized light.
12. The LED of claim 8, wherein the active layer is thinner than a critical thickness to avoid generation of misfit dislocations that release strain.
13. The LED of claim 8, wherein the active layer is AlInGaN to adjust strain.
14. A method of fabricating a Light-Emitting Diode (LED), comprising:
   controlling a degree of polarization of light emitted from the LED by forming one or more III-nitride light-emitting layers on a III-nitride layer, wherein the III-nitride light-emitting layers have an Indium (In) content that increases a polarization ratio of light emitted by the III-nitride light-emitting layers to greater than 0.8.
15. The method of claim 14, wherein the controlling step comprises changing the Indium (In) content in the III-nitride light-emitting layers to control induced strain.
16. The method of claim 15, wherein
   the III-nitride light-emitting layers comprises $(In_yGa_x)N$ (where $0 \leq x \leq 1$, $0 < y \leq 1$, and $x+y=1$) embedded between one or more $In_yGaN$ or GaN barrier layers, and the controlling step comprises changing the In content $(y, 0 < y \leq 1)$ in the III-nitride light-emitting layers to control the induced strain, while In content of the barrier layers is unchanged.
17. The method of claim 16, further comprising changing an Aluminum (Al) content of the III-nitride light-emitting layers to AlInGaN to adjust strain while an Al content of the barrier layers is unchanged.
18. The method of claim 14, wherein the controlling step comprises increasing the degree of polarization by increasing the Indium (In) content in one or more of the III-nitride light-emitting layers.

19. The method of claim 18, wherein the increased In content increases a strain in the III-nitride light-emitting layers due to an increased lattice mismatch with the III-nitride layer, in order to increase the polarization ratio.

20. A method for emitting light from a light-emitting diode (LED), comprising:
emitting polarized light from one or more III-nitride light-emitting layers formed on a III-nitride layer of the LED, wherein the III-nitride light-emitting layers have an Indium (In) content that increases a polarization ratio of the light emitted by the III-nitride light-emitting layers to greater than 0.8.

* * * * *